(12) United States Patent
Bratkovski et al.

(10) Patent No.: US 7,985,962 B2
(45) Date of Patent: Jul. 26, 2011

(54) MEMRISTIVE DEVICE

(75) Inventors: Alexandre M. Bratkovski, Mountain View, CA (US); Douglas Ohlberg, Mountain View, CA (US); Jianhua Yang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 35 days.

(21) Appl. No.: 12/342,399

(22) Filed: Dec. 23, 2008

(65) Prior Publication Data
US 2010/0155686 A1 Jun. 24, 2010

(51) Int. Cl.
*H01L 29/02* (2006.01)

(52) U.S. Cl. ......... 257/4; 257/5; 257/E29.002; 438/102; 438/103; 365/163

(58) Field of Classification Search ............... 257/2–5, 257/E29.002; 438/102–103; 365/163
See application file for complete search history.

(56) References Cited

U.S. PATENT DOCUMENTS

| 2001/0053740 A1* | 12/2001 | Kim .............................. 501/134 |
| 2003/0062553 A1* | 4/2003 | Ramesh et al. ............... 257/295 |
| 2008/0090337 A1* | 4/2008 | Williams ....................... 438/133 |

* cited by examiner

*Primary Examiner* — Bradley K Smith
*Assistant Examiner* — Jami M Valentine

(57) ABSTRACT

A memristive device includes a first electrode, a second electrode, and an active region disposed between the first and second electrodes. At least one of the first and second electrodes is a metal oxide electrode.

14 Claims, 1 Drawing Sheet

MEMRISTIVE DEVICE

BACKGROUND

The present disclosure relates generally to memristive devices.

Nanometer-scale crossed-wire switching devices have previously been reported that could be switched reversibly and had an ON-to-OFF conductance ratio up to about $10^3$. Such devices have been used to construct crossbar circuits and provide a promising route for the creation of ultra-high density nonvolatile memory. A latch (which is an important component for logic circuits and for communication between logic and memory) has been fabricated from a series connection of crossed-wire switches. New logic families, constructed entirely from crossbar arrays of switches or as hybrid structures composed of switches and transistors, have also been described. These new logic families have the potential to dramatically increase the computing efficiency of CMOS and hybrid circuits.

BRIEF DESCRIPTION OF THE DRAWINGS

Features and advantages of embodiments of the present disclosure will become apparent by reference to the following detailed description and drawings, in which like reference numerals correspond to the same or similar, though perhaps not identical, components. For the sake of brevity, reference numerals having a previously described function may or may not be described in connection with subsequent drawings in which they appear.

DETAILED DESCRIPTION

Embodiments of the memristive device disclosed herein include an active region located between two wires/electrodes. Within the active region, oxygen vacancies migrate, and such migration is believed to result in memristive effects. Memristors, the switching mechanism of which is believed to be based on oxygen vacancy migration, are quite different from perovskite oxide ferroelectrics, where it is desirable to prevent oxygen vacancies from forming altogether. In memristors, the loss of such vacancies from the device is believed to deteriorate the device performance over time. In the embodiments disclosed herein, at least one of the two electrodes is a metal oxide electrode, which is believed to reduce or eliminate the escape of oxygen from the device, thus keeping the stoichiometry of the junction (which includes the active region) constant. Reducing or preventing oxygen escape from the memristive device advantageously prolongs the useful life of the device.

Figure 1A:
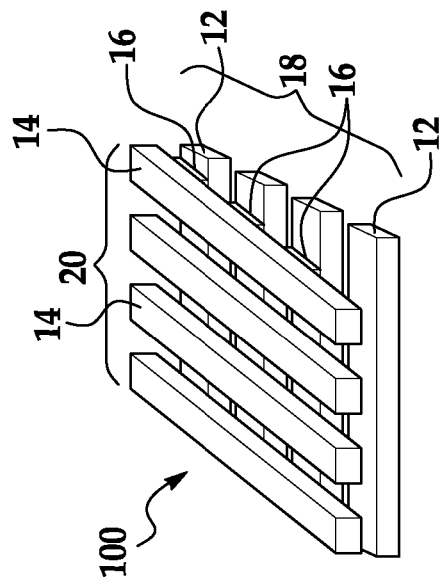
FIG. 1A is a perspective view of an embodiment of a solid-state electrically actuated device connecting two different crossed wires/electrodes.

Referring now to FIG. 1A, a solid-state electrically actuated switch 10 is depicted. Two different crossed wires or electrodes 12, 14 have an active region 16 therebetween.

The active region 16 is a switch junction which includes a primary active region 16a and a secondary active region 16b.

In one embodiment, the primary active region 16a is a material that is both an electronically semiconducting and a weak ionic conductor that can be doped with electron donors as interstitials, vacancies, or impurities. In another embodiment, the material of the primary active region 16a is both nominally electrically insulating and a weak ionic conductor. The secondary active region 16b is a material that acts as a source and sink of the doping species.

The primary active region 16a is capable of transporting and hosting ions that act as dopants to control the flow of electrons through the device 10. The basic mode of operation of the device 10 is to apply an electrical field (the drift field, which may exceed some threshold for enabling the motion of the ions in the primary active region 16a) across the device 10 large enough to cause mobile dopants to be transported within the primary active region 16a via ionic transport. The mobile dopants are generally an ionic species that change the electrical conductivity of the primary active region 16a from low conductivity (i.e. an undoped semiconductor or insulator—switch-OFF configuration) to high conductivity (doped to provide a higher conductivity—switch-ON configuration) or from high electrical conductivity to low conductivity (switch-ON to switch-OFF). As such, the reconfiguration of the dopant profile under electric field changes the electrical transport behavior of the junction 16.

The primary active region 16a is also a thin film (e.g., equal to or less than 500 nm) of a material that is electronically semiconducting or nominally electrically insulating and is a weak ionic conductor. It is to be understood that the definition of weak ionic conductor depends upon the application for which the device 10 is designed. The mobility and the diffusion constant for a dopant in a lattice are directly proportional to one another, via the "Einstein relation". Thus, if the mobility of ionized dopants in a lattice is very high, so is the diffusion constant. In general, it is desired for a device 10 to stay in a particular state, ON or OFF, for an amount of time that may range from a fraction of a second to years, depending on the application. Therefore, a "weak ionic conductor" is one in which the ion mobility, and thus the diffusion constant, is small enough to ensure the stability of the ON or OFF state of the device 10 for as long as necessary under the desired conditions (e.g., the device 10 does not change state because of diffusion of the mobile dopants). Furthermore, the diffusion constant for such a device 10 is, in an embodiment, low enough to ensure the desired level of stability, to avoid inadvertently turning the device 10 from ON to OFF or vice versa via ionized dopant diffusion, rather than by intentionally setting the state of the device 10 with a voltage pulse.

As such, the primary active region 16a material and the mobile dopants (i.e., the secondary active region 16b) are selected such that the drift of the mobile dopants into or out of the primary active region 16a is possible, but not too facile. This generally ensures that the device 10 will remain in whatever state it is set for a reasonably long time. This also contributes to the device 10 being nonvolatile (i.e., it holds its state after the drift field has been removed). In some instances, the device 10 is a two-terminal device—applying a high bias to the device 10 causes both electron current and ion current to flow, whereas at a low bias the flow of ion current is negligible, which allows the device 10 to hold its resistance state.

The secondary active region 16b is a material which acts as a source of dopants for the primary active region 16a. It is to be understood that the secondary active region 16b may be formed as a layer during device 10 manufacture, or it may be formed after device 10 manufacture. In some instances, the secondary active region 16b is established before or during the establishment of the primary active region 16a. In other instances, it may be possible to introduce the secondary active region 16b from a separate region (not shown) during device 10 programming. When the material/dopants making up the secondary active region 16b are introduced from a separate region, such introduction may take place either before or after the primary active region 16b has been established on the electrode 12. This depends, at least in part, on the geometry of the device 10 (e.g., whether the primary active region 16a is below or above the separate region containing the material/dopants). Some non-limiting examples of techniques suitable for introducing the material/dopants to form the secondary active region 16b include the following: i) implanting the material/dopants into the primary active region 16a to form the secondary active region 16b; or ii) diffusing the material/dopants from a gaseous source (before, during or after establishment of the primary active region 16a); or iii) implanting (e.g., via ion implantation) the material/dopants into a region (not shown) adjacent to the established primary active region 16a and then diffusing the material/dopants from the adjacent region; or iv) during establishing of the primary active region 16a, adding the material/dopants thereto from a gaseous precursor. In another embodiment, an ionic species embedded into a layer bordering the secondary active region 16b may be moved into the secondary active region 16b when a predetermined electric field is applied. In still another embodiment, an ionic species embedded into a layer bordering the primary active region 16a may be moved into the primary active region 16a (e.g., through an electrode 12, 14) to form the secondary active region 16b when a predetermined electric field is applied.

In any of the embodiments, it is generally desirable that the dopants are non-homogeneously distributed (e.g., in the vertical direction in the devices 10, 10', 10" shown in the Figures herein) in the active region 16 prior to actuation, thereby facilitating switching upon actuation.

As a limiting example of forming the secondary active region 16b, dopant initiators may be diffused from a region or source into the primary active region 16b, where they react with a portion (e.g., a few nanometers or less) of the primary active region 16a. This chemical reaction forms the secondary active region 16b having mobile dopants therein at the interface between the remaining primary active region 16a and the electrode 12, 14 (depending, at least in part, from where the dopant initiators are diffused). Non-limiting examples of dopants that result from the chemical reaction include interstitials, vacancies or other charged impurities. Such mobile dopants are positively or negatively charged. In one non-limiting example, titanium (e.g., a suitable dopant initiator) may diffuse through a platinum electrode and react with titanium dioxide (e.g., the primary active region 16a). This chemical reaction causes the reduction of a portion of the metal oxide (i.e., the primary active region 16a), resulting in the formation of a $TiO_{2-x}$ secondary active region 16b at the interface between the remaining titanium dioxide primary active region 16a and the platinum electrode 12. This $TiO_{2-x}$ secondary active region 16b has a small deficit of oxygen atoms in the crystal structure, and the sites where the missing oxygen atoms would be positively charged vacancies, or mobile dopants.

The active region 16 may also include a molecular layer 16c as a non-covalently bonded interface, where the molecular layer 16c includes molecules that may or may not be switchable.

As depicted in FIG. 1A, the active region 16 is established between two electrodes 12, 14. In this embodiment, one of the two electrodes 12, 14 is a metal oxide electrode and the other of the two electrodes 14, 12 is a metal electrode. While in this embodiment the bottom electrode 12 is referred to as the metal oxide electrode and the top electrode 14 is referred to as the metal electrode, it is to be understood that the bottom electrode 12 may be formed of metal and the top electrode 14 may be formed of metal oxide. It is to be further understood that the device 10 may be configured laterally, instead of vertically (as shown in the Figures). Still further, it is to be further understood that the polarity of the device 10 may be altered by selecting particular materials for the active region 16 and the metal oxide electrodes, and selecting either the bottom/first or top/second electrode 12, 14 as the metal oxide electrode.

In another embodiment, both of the electrodes 12, 14 are metal oxide electrodes.

Non-limiting examples of suitable metal oxides for the metal oxide electrode(s) 12 include $RuO_2$, $IrO_2$, $SrRuO_3$, $Ce_2O_3$, $MoO_2$, $OSO_2$, $WO_2$, $CrO_2$, metallic manganites, and rare earth metal oxides (e.g., EuOx). The selection of the particular metal oxide will depend, at least in part, on the selection of the materials for the active region 16. In some instances, it may be desirable that the metal oxide electrode 12 be lattice matched to the active region 16. The lattice matching allows for epitaxial growth of a quality contact, which may be desirable.

The incorporation of such a metal oxide electrode 12 in the device 10 advantageously blocks oxygen from escaping out of the device 10, thereby enhancing device performance and lifetime. The metal oxide electrode 12 may be formed via any suitable technique. Non-limiting examples of such techniques include sputtering/evaporating from metal oxide targets, sputtering/evaporating from metal target followed by an oxidation process, reactive sputtering from a metal target with $O_2$ gas, chemical vapor deposition of oxides (CVD), atomic layer deposition of oxide (ALD), pulsed laser deposition (PLD), molecular beam epitaxy (MBE), or the like. In another non-limiting example, from about 0.5 nm to about 100 nm of Ir is deposited (the thickness of which may depend, at least in part on the processing techniques utilized), then from about 1 nm to about 100 nm Ru or $RuO_2$ is deposited on the Ir, and then the active region material (e.g., $TiO_2$) is deposited on the Ru or $RuO_2$. The Ru will absorb oxygen from the active region to form an $RuO_2$ metal oxide electrode. It is believed that Ir acts as a suitable wetting layer for the deposition of Ru. The Ir electrode may also oxidize to form highly conductive iridium oxides and suboxides. The thickness of the metal oxide electrode 12 and/or 14 ranges from about 2 nm to about 200 nm.

In this particular embodiment, the top electrode 14 is a metal electrode, formed of any suitable conductive material, such as gold, platinum, tungsten, copper, etc. The metal electrode 14 may be fabricated using conventional techniques, such as photolithography or electron beam lithography, or by more advanced techniques, such as imprint lithography. In one embodiment, the thickness of the metal electrode 14 ranges from about 5 nm to about 30 nm.

When one of the electrodes 12 is a metal oxide and the other of the electrodes 14 is a metal, it is to be understood that the metal oxide electrode 12 may serve as an oxygen reservoir during operation of the device 10. For example, when a $RuO_2$ metal oxide electrode is used, during device 10 operation, the $RuO_2$ may be partially reduced, thereby moving oxygen from the $RuO_2$ layer into the active region 16.

Figure 1B:
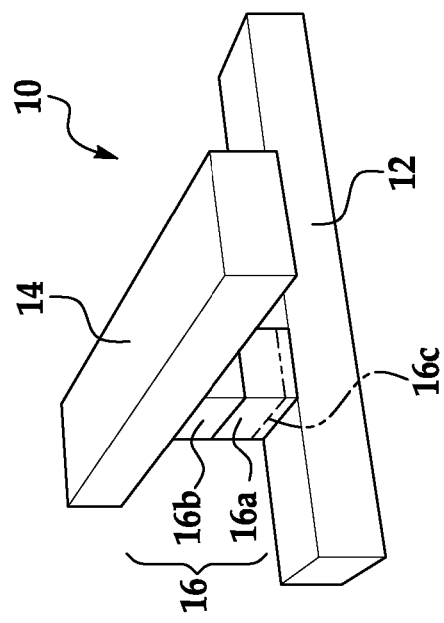
FIG. 1B is a perspective view showing an array of the devices of FIG. 1A, also known as a crossbar.

Referring now to FIG. 1B, a crossbar array 100 may also be formed including a plurality of the solid-state electrically actuated devices 10 shown in FIG. 1A. It is to be understood that crossbar arrays 100 may also be formed including the embodiments of the device 10', 10", 10'" described hereinbelow. As shown in FIG. 1B, a first layer 18 of approximately parallel electrodes 12 is overlain by a second layer 20 of approximately parallel electrodes 14. The second layer 20 is roughly perpendicular, in orientation, to the electrodes 12 of the first layer 18. It is to be understood, however, that the orientation angle between the layers 18, 20 may vary. The two layers 18, 20 of electrodes 12, 14 form a lattice, or crossbar. Each electrode 14 of the second layer 20 overlies all of the electrodes 12 of the first layer 18, and comes into close contact with each electrode 12 of the first layer 18 at intersections that represent the closest contact between two electrodes 12, 14. The active region 16 is shown disposed between electrodes 12, 14. While three such active regions 16 are shown, it is to be understood that an active region 16 is formed at each intersection of an electrode 12 with an electrode 14. Such crossbars 100 may be fabricated from micron-, submicron- or nanoscale-wires, depending on the application.

Although individual electrodes 12, 14 in the Figures are shown with square or rectangular cross-sections, electrodes 12, 14 may also have circular, elliptical, or more complex cross-sections. The electrodes 12, 14 may also have many different widths or diameters and aspect ratios or eccentricities. The term "nanowire crossbar" may refer to crossbars having one or more layers of sub-microscale wires, microscale wires or wires with larger dimensions, in addition to nanowires.

Figure 2:
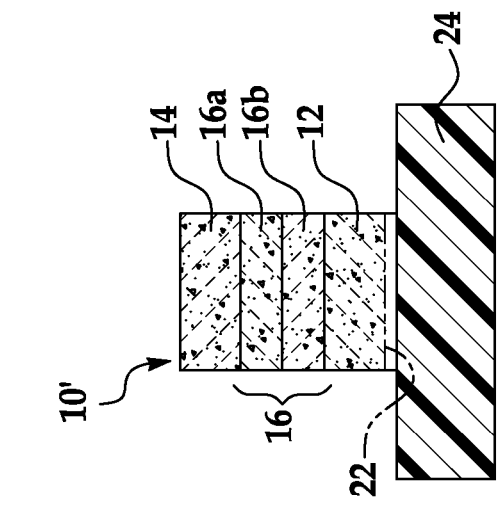
FIG. 2 is a schematic cross-sectional view of another embodiment of the electrically actuated device.

Referring now to FIG. 2, another embodiment of the device 10' is depicted. In this embodiment, the top electrode 14 is the metal oxide electrode and the bottom electrode 12 is the metal electrode. This embodiment of the device 10' is established on a substrate 24 and includes an adhesion layer 22 between the bottom electrode 12 and the substrate 24.

The substrate 24 may be any desirable material, including, but not limited to semiconductor materials. Non-limiting examples of specific substrate 24 materials include silicon dioxide, silicon nitride, aluminum nitride, magnesium oxide, strontium titanate, glass, or the like.

The adhesion layer 22 is shown established directly on a substrate 24, and the bottom electrode 12 is established on the adhesion layer 22. Generally, the adhesion layer 22 enhances the bond between the substrate 24 and the subsequently established bottom electrode 12. In some instances, the adhesion layer 22 may be a source of at least one of the dopants for the secondary active region 16b, which diffuse through the bottom electrode 12 when exposed to certain conditions. Non-limiting examples of suitable materials for the adhesion layer 22 include titanium, chromium, aluminum, magnesium, zinc, niobium, tantalum, manganese, vanadium, zirconium, or hafnium. The adhesion layer 22 may be established on the substrate 24 via any suitable technique, such as, for example, sputtering, e-beam evaporation, molecular beam epitaxy, chemical vapor deposition (CVD), or atomic layer deposition (ALD). It is to be understood, as shown in the embodiment of FIGS. 1A and 1B, that the adhesion layer 22 may be omitted if desirable. It is to be further understood that when the layer 22 is used solely as a source of the dopants, such layer 22 may be positioned adjacent to any electrode 12, 14 (or a side electrode, not shown).

Figure 3:
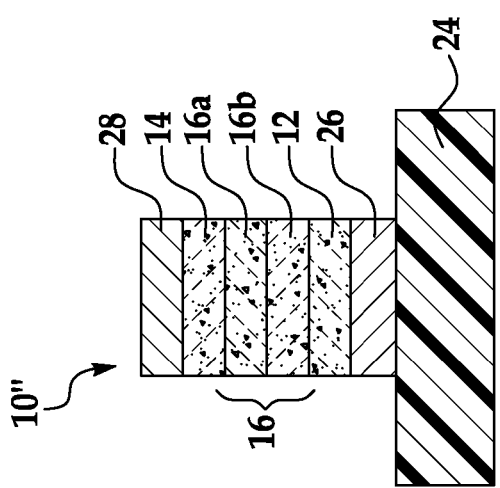
FIG. 3 is a schematic cross-sectional view of still another embodiment of the electrically actuated device.

Referring now to FIG. 3, still another embodiment of the device 10" is depicted. In this embodiment, both the top and bottom electrodes 12, 14, which are positioned directly adjacent to the active region 16, are metal oxide electrodes. The positioning of such metal oxide electrodes 12, 14 in this embodiment provides an additional barrier to oxygen leaking from the device 10".

The device 10" further includes metal electrodes 26, 28 established adjacent to the metal oxide electrodes 12, 14. More particularly, the metal electrode 26 has the bottom metal oxide electrode 12 established thereon, and the metal electrode 28 is established on the top metal oxide electrode 14. The materials and methods for establishing such metal electrodes 26, 28 are similar to those previously described hereinabove in reference to the other Figures.

Furthermore, when the metal oxide electrode 12, 14 and the metal electrode 26, 28 serve together as a single electrode, the metal oxide electrode 12, 14 is selected as a metal oxide with a smaller optical bandgap and a larger effective dielectric constant than the bandgap and dielectric constant of the primary active region 16a.

Figure 4:
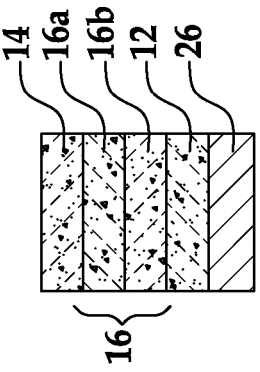
FIG. 4 is a schematic cross-sectional view of yet another embodiment of the electrically actuated device.

In still another embodiment, as shown in FIG. 4, the device 10'" includes one metal oxide electrode and two metal electrodes. As shown in the Figure, the electrodes 14, 26 are metal electrodes, and the metal oxide electrode 12 is established between the metal electrode 26 and the active region 16. It is to be understood that the metal oxide electrode 12 may also be positioned between the metal electrode 14 and the active region 16 instead.

In some of the embodiments disclosed herein, the substrate 24 is shown having the electrodes 26, 12, 14, 28 and the active region 16 established thereon. However, it is to be understood that in some instances, the substrate 24 may not be desirable, for example, as shown in FIG. 4.

In any of the embodiments disclosed herein, selection of the materials for the primary and secondary active regions 16a, 16b contributes to achieving desirable device 10, 10', 10", 10'" properties. Some examples of such materials have been described hereinabove. It is to be understood, however, that there is a wide range of materials that exhibit the desired combination of properties: electronically semiconducting or insulating and weak ionic conductor to enable the mobile dopants to be injected by drift into and ejected out of the primary active region 16a responsible for the memristive behavior.

In general, any semiconducting material (making up primary active region 16a) that is also a weak ionic conductor with respect to the mobile dopant in the secondary active region 16b that can electrically dope the semiconductor will work in the embodiments disclosed herein. In other words, possible switch compounds for the primary active region 16a are semiconducting compounds with significant ionic contribution to the bonding. In a non-limiting example, the primary active region 16a is a material that is undoped and stoichiometric, and thus a good insulator, and the mobile dopant is a large concentration of anion or cation vacancies contained in the secondary active region 16b, which is a layer of the same material as, or a related material to the primary active region 16a. Basically, the secondary active region 16b having the mobile dopants therein is very conductive and thus changing the doping concentration has a relatively small effect on the conductivity of this layer; but since the primary active region 16a is essentially intrinsic, even a small amount of mobile dopant will have a very dramatic effect on the conductivity of this region 16a.

In one embodiment, the material for the primary active region 16a is selected from oxides, sulfides, selenides, nitrides, phosphides, arsenides, chlorides, and bromides of the transition and rare earth metals, with the alkaline earth metals often being present in compounds. Further, there are the various alloys of like compounds with each other, which offer a wide range of compositions if they are mutually soluble in each other. There are also mixed compounds, in which there are two, three or more different metal atoms combined with some number of the electronegative elements. In such instances, the mobile dopants in the secondary active region 16b may be anion vacancies or different valent elements.

Materials for the primary active region 16a including the elements Ti, Zr and Hf are particularly attractive because they are compatible with Si integrated circuit technology, since the primary oxidation state of all three metals is +4, the same as Si. As such, these elements would not create unintentional doping of the Si. Oxides of these compounds are also known as titania, zirconia, and hafnia, respectively, and also by other names specific to the various polytypes of each. Still another embodiment includes the alloys of these three oxides in pairs or with all three present simultaneously (e.g., $Ti_xZr_yHf_zO_2$, where $x+y+z=1$). Related sets of compounds include the titanates, zirconates and hafnates, which are represented by the specific example $SrTiO_3$, where Sr is the divalent element strontium. There is a wide variety of such compounds in which Ca, Ba, and other divalent elements (e.g., Mg, Zn, Cd) may be substituted for Sr, and Zr and Hf substituted for Ti. These compounds may be represented as $ABO_3$ compounds, where A is at least one divalent element and B is at least one of Ti, Zr, and Hf, and may have the perovskite structure.

It is also possible to utilize alloys of these various compounds, such as $Ca_aSr_bBa_cTi_xZr_yHf_zO_3$, where $a+b+c=1$ and $x+y+z=1$. There is also a wide variety of other oxides of the transition and rare earth metals with different valencies that may be used, both individually and as more complex compounds. In each case, the mobile dopants in the secondary active region 16b may be an oxygen vacancy or an aliovalent (e.g., different valence) element.

Yet another embodiment of compounds suitable for the primary active region 16a includes the sulfides and selenides of the transition metals with some ionic bonding character, essentially the S and Se analogues of the oxides mentioned above. Still another embodiment of compounds suitable for the primary active region 16a includes the semiconducting nitrides, such as AlN, GaN, ScN, YN, LaN, rare earth nitrides, and alloys of these compounds and more complex mixed metal nitrides. A still further embodiment of compounds suitable for the primary active region 16a includes the semiconducting halides (such as CuCl, CuBr, and AgCl), or the phosphides and arsenides of various transition and rare earth metals, e.g., Sc, Y, La, etc. In each of the examples set forth in this paragraph, either anion vacancies or aliovalent elements may be used as the mobile dopants in the secondary active region 16b.

It is to be further understood that the active region 16 may include sublayers of different materials or compounds chosen from the examples above.

While some examples are listed hereinabove, suitable dopants employed in the secondary active region 16b may be hydrogen, alkali, and alkaline earth cations, transition metal cations, rare earth cations, oxygen anions or vacancies, chalcogenide anions or vacancies, nitrogen anions or vacancies, pnictide anions or vacancies, or halide anions or vacancies. Specific non-limiting examples of mobile dopant anions include carbon anions, sulfur anions, or phosphorus anions, and specific non-limiting examples of mobile dopant cations include aluminum cations, niobium cations, copper cations, and silver cations.

Specific examples of the combination of primary active regions 16a and secondary active regions 16b are set forth in the Table below. Based on the present teachings, it is clear that one skilled in this art can develop other combinations of materials that provide the benefits taught herein.

TABLE 1

Examples of Primary and Secondary Active Regions and Corresponding Mobile Dopants

| Primary Active Region | Secondary Active Region | Mobile Dopant |
|---|---|---|
| $TiO_2$ | $TiO_{2-x}$ | Oxygen vacancies or metal interstitials |
| $ZrO_2$ | $ZrO_{2-x}$ | Oxygen vacancies or metal interstitials |
| $HfO_2$ | $HfO_{2-x}$ | Oxygen vacancies or metal interstitials |
| $SrTiO_3$ | $SrTiO_{3-x}$ | Oxygen vacancies or metal interstitials |
| GaN | $GaN_{1-x}$ | Nitrogen vacancies |
| CuCl | $CuCl_{1-x}$ | Chlorine vacancies or copper interstitials |
| GaN | GaN:S | Sulfide ions |

Furthermore, the switching mechanism of the devices 10, 10', 10", 10''' disclosed herein may be due to a barrier for transport at the interface (when the device 10, 10', 10", 10''' is in an OFF state) between the metal electrode and the active region 16 that is shunted by the drift of mobile dopants into the primary active region 16a (when the device 10, 10', 10", 10''' is in an ON state). Is to be understood, however, that the switching mechanism of the device 10, 10', 10" may be different. Another non-limiting example of a possible switching mechanism includes the mobile dopants forming conducting filaments that bridge the electrodes 12, 14 or 26, 28 when the device 10, 10', 10", 10''' is in the ON state. This bridge may be broken by application of an electric field or Joule heating, thereby switching the device 10 to the OFF state.

While several embodiments have been described in detail, it will be apparent to those skilled in the art that the disclosed embodiments may be modified. Therefore, the foregoing description is to be considered exemplary rather than limiting.

What is claimed is:

1. A memristive device, comprising:
  a first electrode;
  a second electrode, at least one of the first electrode or the second electrode being a metal oxide electrode; and
  an active region disposed between the first and second electrodes, the active region including:
    a primary active region that is either electrically semiconducting, or nominally electrically insulating and is also a weak ionic conductor; and
    a secondary active region that is a source of dopants for the primary active region.

2. The memrisitive device as defined in claim 1 wherein both the first electrode and the second electrode are metal oxide electrodes, and wherein the memristive device further comprises:
  a first metal electrode upon which the first metal oxide electrode is established; and
  a second metal electrode established on the second metal oxide electrode.

3. The memristive device as defined in claim 1 wherein one of the second electrode or the first electrode is the metal oxide electrode and wherein an other of the first electrode or the second electrode is a metal electrode.

4. The memristive device as defined in claim 3 wherein the metal oxide electrode is an oxygen reservoir for the active region.

5. The memristive device as defined in claim 1 wherein the metal oxide electrode is selected from $RuO_2$, $IrO_2$, $SrRuO_3$, $Ce_2O_3$, $MoO_2$, $OsO_2$, $WO_2$, $CrO_2$, metallic manganites, and rare earth metal oxides.

6. The memristive device as defined in claim 1 wherein the metal oxide electrode substantially prevents $O_2$ from escaping from the active region.

7. The memristive device as defined in claim 1 wherein the first electrode is a metal oxide electrode, wherein the second electrode is a metal electrode, and wherein the memristive device further comprises an other metal electrode established adjacent to the first electrode.

8. A method of making the memristive device of claim 1, the method comprising:
   selecting at least one of the first electrode or the second electrode as the metal oxide electrode;
   establishing the active region adjacent to the first electrode, the active region including:
      a primary active region that is either electrically semi-conducting, or nominally electrically insulating and is also a weak ionic conductor; and
      a secondary active region that is a source of dopants for the primary active region; and
   establishing the second electrode adjacent to the active region.

9. The method as defined in claim 8 wherein selecting includes selecting both the first electrode and the second electrode as metal oxide electrodes, and wherein the method further comprises:
   establishing the first metal oxide electrode on a first metal electrode; and
   establishing a second metal electrode on the second metal oxide electrode.

10. The method as defined in claim 8 wherein one of the second electrode or the first electrode is the metal oxide electrode, and wherein the method further comprises selecting an other of the first electrode or the second electrode as a metal electrode.

11. The method as defined in claim 10, further comprising configuring a polarity of the memristive device by selecting the one of the second electrode or the first electrode as the metal oxide electrode and the other of the first electrode or the second electrode as the metal electrode.

12. The method as defined in claim 8 wherein one of the first and second electrodes is the metal oxide electrode, wherein an other of the second or first electrodes is a metal electrode, and wherein the method further comprises establishing an other metal electrode adjacent to the one of the first and second electrodes that is the metal oxide electrode.

13. The method as defined in claim 8 wherein the metal oxide electrode is selected from $RuO_2$, $IrO_2$, $SrRuO_3$, $Ce_2O_3$, $MoO_2$, $OsO_2$, $WO_2$, $CrO_2$, metallic manganites, and rare earth metal oxides.

14. The memristive device as defined in claim 1 wherein materials for the primary active region/secondary active region are selected from: $TiO_2/TiO_{2-x}$, $ZrO_2/ZrO_{2-x}$, $HfO_2/HfO_{2-x}$, $SrTiO_3/SrTiO_{3-x}$, $GaN/GaN_{1-x}$, $CuCl/CuCl_{1-x}$, and $GaN/GaN{:}S$.

* * * * *

UNITED STATES PATENT AND TRADEMARK OFFICE
CERTIFICATE OF CORRECTION

PATENT NO. : 7,985,962 B2
APPLICATION NO. : 12/342399
DATED : July 26, 2011
INVENTOR(S) : Alexandre M. Bratkovski et al.

It is certified that error appears in the above-identified patent and that said Letters Patent is hereby corrected as shown below:

In column 8, line 49, in Claim 2, delete "memrisitive" and insert -- memristive --, therefor.

Signed and Sealed this
Twentieth Day of March, 2012

David J. Kappos
*Director of the United States Patent and Trademark Office*